(12) United States Patent
Gulati et al.

(10) Patent No.: US 11,300,874 B2
(45) Date of Patent: Apr. 12, 2022

(54) DIFFRACTIVE OPTICAL ELEMENT FABRICATION

(71) Applicant: Finisar Corporation, Horsham, PA (US)

(72) Inventors: Nitesh Gulati, Rosebery (AU); Vincent Choo, Rosebery (AU); Yiwei Xu, Rosebery (AU); Glenn Wayne Baxter, Hornsby Heights (AU); Steven James Frisken, Vaucluse (AU)

(73) Assignee: II-VI Delaware, Inc., Wilmington, DE (US)

( * ) Notice: Subject to any disclaimer, the term of this patent is extended or adjusted under 35 U.S.C. 154(b) by 142 days.

(21) Appl. No.: 16/382,137

(22) Filed: Apr. 11, 2019

(65) Prior Publication Data
US 2019/0317256 A1    Oct. 17, 2019

Related U.S. Application Data

(60) Provisional application No. 62/657,739, filed on Apr. 14, 2018.

(51) Int. Cl.
*G02B 5/18*    (2006.01)
*G02B 3/00*    (2006.01)
*G03F 7/00*    (2006.01)

(52) U.S. Cl.
CPC ......... *G03F 7/0005* (2013.01); *G02B 3/0012* (2013.01); *G02B 3/0018* (2013.01); *G02B 5/1814* (2013.01); *G02B 5/1857* (2013.01)

(58) Field of Classification Search
CPC ... G03F 7/0005; G02B 3/0018; G02B 3/0012; G02B 5/1814; G02B 5/1857
See application file for complete search history.

(56) References Cited

U.S. PATENT DOCUMENTS

2015/0309220 A1\* 10/2015 Greiner ................... G02B 5/18
359/350

\* cited by examiner

*Primary Examiner* — Robert E. Tallman
(74) *Attorney, Agent, or Firm* — Blank Rome LLP (57) ABSTRACT

Described herein are embodiments of a diffractive optical element (23) such as a grism. In one embodiment, the diffractive optical element (23) includes an input surface (31) configured to receive an input optical signal (29), a diffractive surface (33) adapted to spatially disperse the input optical beam (29) into a dispersed signal and an output surface (35) configured to output the dispersed signal from the diffractive optical element. The input surface (31) and the diffractive surface (33) are non-parallel and the diffractive surface (33) is formed in situ by a photolithographic technique.

25 Claims, 9 Drawing Sheets

DIFFRACTIVE OPTICAL ELEMENT FABRICATION

RELATED APPLICATION SECTION

The present application is a non-provisional of U.S. Provisional Patent Application Ser. No. 62/657,739, filed Apr. 14, 2018, and entitled "DIFFRACTIVE OPTICAL ELEMENT FABRICATION". The entire contents of U.S. Patent Application Ser. No. 62/657,739 are incorporated herein by reference.

FIELD OF THE INVENTION

The present invention relates to diffractive optical elements and methods for their manufacture. Embodiments of the invention have been particularly adapted for optical grating-prisms (or "grisms"). While some embodiments will be described herein with particular reference to that application, it will be appreciated that the invention is not limited to such a field of use, and is applicable in broader contexts.

BACKGROUND

Any discussion of the background art throughout the specification should in no way be considered as an admission that such art is widely known or forms part of common general knowledge in the field.

In optical devices, a grism is a diffractive optical element comprising a combination of a prism and a diffraction grating. Grisms are used in a similar manner to diffraction gratings to select particular wavelengths of light but provide increased dispersive power to better separate the constituent wavelengths from one another.

Current techniques for fabricating high performance grisms include writing of a diffraction grating onto a glass wafer, and subsequently bonding that wafer onto a prism with an epoxy or optical contact bonding. This two-step fabrication technique is typically done using expensive semiconductor grade steppers (Nikon, etc. . . . ), which require multiple exposures per wafer. Steppers also provide very low depth of focus which limits the grating writing to ultra-flat substrate (typically flat to within <0.3 µM) to print high resolution structures.

The inventors have identified some deficiencies in this technique. For example, not only does optical component bonding require additional equipment, optical performance consistency has been found to be compromised with bonded optics.

SUMMARY OF THE INVENTION

In accordance with a first aspect of the present invention there is provided a diffractive optical element including:
an input surface for configured to receiving an input optical signal;
a diffractive surface for adapted to spatially dispersing the input optical beam into a
dispersed signal; and
an output surface for configured to outputting the dispersed signal;
wherein the input surface and the diffractive surface are non-parallel and; and
wherein the diffractive surface is formed in situ by a photolithographic technique.

In some embodiments the diffractive surface and output surface are non-parallel.

In some embodiments the input surface is the output surface.

In some embodiments the optical element is a triangular prism. In some other embodiments the optical element is a trapezoid.

In some embodiments the diffractive surface is formed by:
depositing a layer of pattern material to the diffractive surface;
applying a photoresist layer to the pattern material layer;
creating a diffractive pattern in the photoresist layer using a light source; and
transferring the diffractive pattern in the photoresist layer to the pattern material.

In some embodiments the diffractive surface is formed by:
depositing a photoresist layer to the diffractive surface; and
creating a diffractive pattern in the photoresist layer using a light source.

The pattern material may be selected from one or more of $Si_3N_4$, $TiO_2$, $HfO_2$, amorphous silicon, high refractive index polymer, reflective metal and $Ta_2O_5$.

In some embodiments the high refractive index polymer is spin-on-glass or photoresist.

In some embodiments the reflective metal is selected from chromium, gold, silver, aluminum or nickel.

In some embodiments the photoresist layer includes an anti-reflective coating and primer.

In some embodiments the diffractive pattern in the photoresist layer is created by illuminating the photoresist layer through a photomask. In some embodiments the diffractive pattern in the photoresist layer is created by illuminating the photoresist layer through a photo mask while moving the photoresist layer relative to the mask. In some embodiments the movement is substantially continuous. In some embodiments the photoresist layer is moved a distance of $$z_T = \frac{2p^2}{\lambda}$$

where p is the spatial period of the mask and $\lambda$ is the wavelength of the light source.

In some embodiments the step of depositing a layer of pattern material to the diffractive surface includes sputter coating. In some embodiments the step of depositing a layer of pattern material to the diffractive surface includes evaporation. In some embodiments the step of depositing a layer of pattern material to the diffractive surface includes chemical vapor deposition, plasma-enhanced chemical vapor deposition or low pressure chemical vapor deposition.

In some embodiments the diffractive optical element is configured to operate in a wavelength selective switch. In these embodiments the input optical signal includes a plurality of optical wavelength channels.

In alternative embodiments, the diffractive optical element includes a lens.

In accordance with a second aspect of the present invention there is provided a diffractive optical element including:
an input surface for configured to receiving an input optical signal;
a diffractive surface for adapted to spatially dispersing the input optical beam into a dispersed signal; and
an output surface for configured to outputting the dispersed signal;
wherein the output surface and the diffractive surface are non-parallel; and wherein diffractive surface is formed in situ by a photolithographic technique.

In some embodiments, the input surface is the diffractive surface.

In accordance with a third aspect of the present invention there is provided a diffractive optical element including:
an input surface configured to receive an input optical signal;
a diffractive surface adapted to spatially disperse the input optical beam into a dispersed signal; and
an output surface configured to output the dispersed signal;
wherein the input surface and the diffractive surface are separated by a distance of greater than 5 mm; and
wherein the diffractive surface is formed in situ by a photolithographic technique.

In preferred embodiments, the diffractive optical element is non-wafer structure.

In accordance with a fourth aspect of the present invention there is provided a method of fabricating a diffractive optical element, the method including the steps:
depositing a layer of pattern material directly onto a first surface of a non-cuboid prism, wherein the first surface is non parallel to either or both of an input surface configured to receive an input optical signal and an output surface configured to output a dispersed signal from the diffractive optical element;
applying a photoresist layer to the pattern material layer;
creating a diffractive pattern in the photoresist layer; and
transferring the diffractive pattern in the photoresist layer to the pattern material to define a diffractive surface on the first surface.

In accordance with a fifth aspect of the present invention there is provided a method of fabricating a diffractive optical element, the method including the steps:
depositing a photoresist layer directly onto a first surface of a non-cuboid prism, wherein the first surface is non parallel to either or both of an input surface configured to receive an input optical signal and an output surface configured to output a dispersed signal from the diffractive optical element; and
creating a diffractive pattern in the photoresist layer.

BRIEF DESCRIPTION OF THE DRAWINGS

Preferred embodiments of the disclosure will now be described, by way of example only, with reference to the accompanying drawings in which.

DETAILED DESCRIPTION

Embodiments of the invention will be described herein with specific reference to fabricating grism devices for use in wavelength selective switch (WSS) devices. However, the person skilled in the art will appreciate that the principles described herein are applicable to other optical systems and devices.

System Overview

Figure 1:
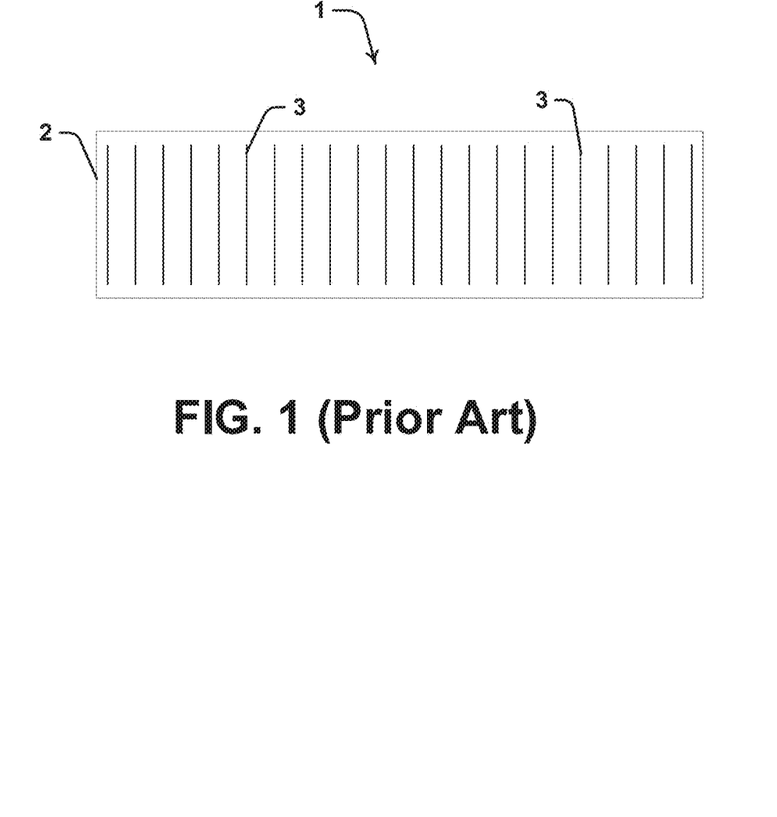
FIG. 1 is a schematic front view of a diffraction grating.

Referring to FIG. 1, there is illustrated schematically a diffraction grating 1 for use in an optical system. The diffraction grating includes a substrate 2 and a substantially linear array of elongate diffracting elements 3 arranged in a grating profile across substrate 2. In general, each diffracting element may include a relative degree of curvature across the face of grating 1 as described in US Patent Application Publication 2014/0347733, to Stewart et al., entitled "Systems and Methods of Aberration Correction in Optical Systems" and assigned to Finisar Corporation. However, for the sake of simplicity, all of the elements 3 in FIG. 1 have zero curvature. Typically, diffracting elements are diffraction lines and include grooves or ridges for a reflective grating, or slots for a transmissive grating. Alternatively, the diffracting elements may be defined as regions in a material having a periodic variation in refractive index.

Figure 2:
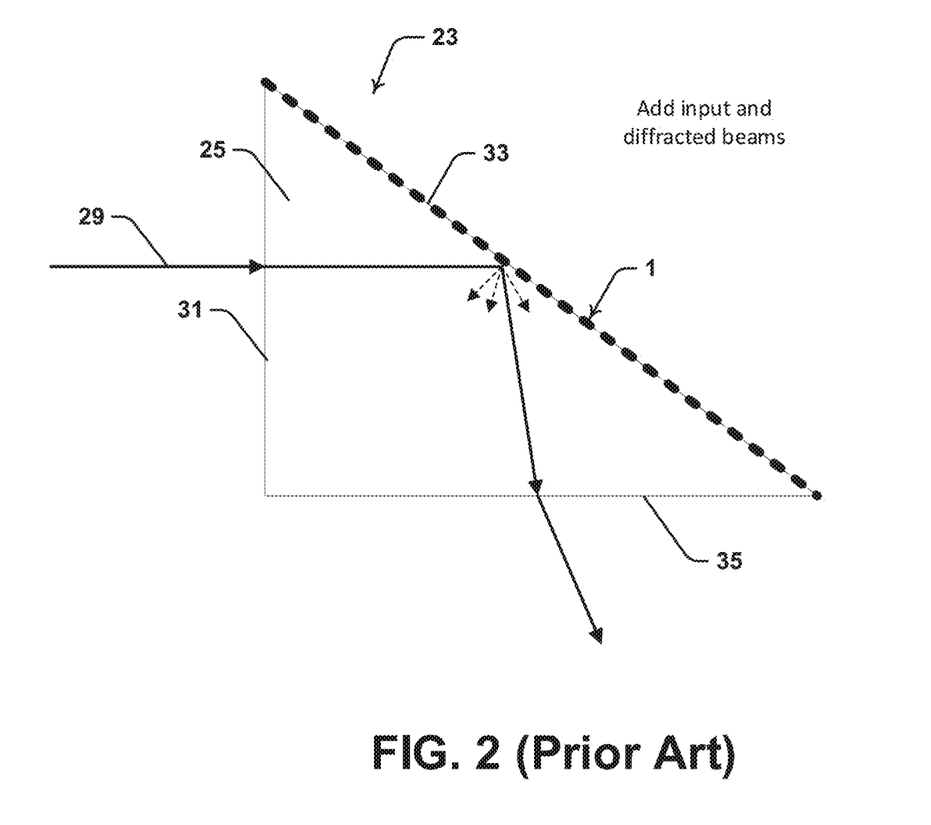
FIG. 2 is a schematic illustration of optical rays through a grism.

In certain optical systems, such as the one discussed below with reference to FIG. 3, it is beneficial to use a grism to spatially disperse wavelengths in an optical beam. A cross-sectional view of an exemplary grism 23 is shown in FIG. 2. The grism 23 includes on optical prism 25 with a diffraction gating 1 located on one of the faces of the prism 25. It will be appreciated that the triangular form of the prism 25 illustrated is exemplary only and in practice could be any prism structure. In preferred embodiments, the prism is a non-cuboid shape.

Cuboid structures are defined as any rectangular prismatic polyhedron. That is, a six faced polyhedron having three pairs of corresponding parallel faces, wherein the faces of each pair have like dimensions and each pair of faces are perpendicularly disposed with respect to the other pairs of faces. Examples of cuboid structures include cubes and rectangular prisms. Examples of non-cuboid structures include trapezoidal prisms, triangular prisms, structures with curved faces and non-rectangular parallelepipeds (structures having at least one non-right angled face).

More generally, the embodiments of the invention are advantageous in non-wafer like prisms which have non parallel surfaces and greater thickness along the optical axis. It is in these non-wafer geometries that direct writing of grating structures is difficult. By wafer, what is meant is a thin slice of substrate, either rectangular, oval or circular (to form a think disk) but having parallel input and output surfaces along the optical axis. Wafers for optical use typically have thicknesses less than 1 mm.

In operation, an input optical beam 29 is incident onto a first face defining an input surface 31 of grism 23. The beam 29 is refracted through the prism 25 and incident onto a second face defining a diffractive surface 33 of grism 23. The diffractive surface 33, which is non-parallel to the input surface, includes grating 1 and acts to diffract or spatially disperse the optical beam 29 into a diffracted spectrum including a plurality of wavelengths. These wavelengths are diffracted at different angles and are coupled out of prism 25 at a third face defining an output surface 35.

In other embodiments (not illustrated), grism 23 may operate in other configurations in which the optical beam 29 is both input and output through the same surface of prism 25.

Overview of Exemplary WSS Framework

Figure 3:
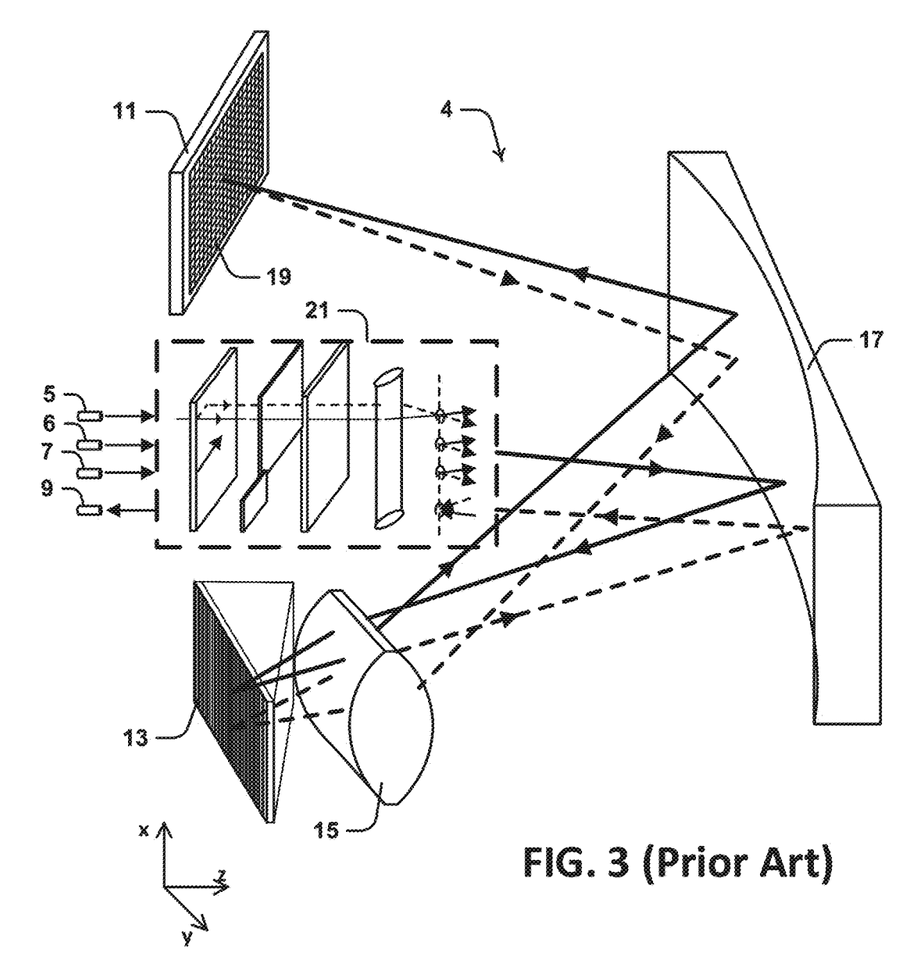
FIG. 3 is a perspective view of a wavelength selective switch incorporating a grism as a diffractive element.

With reference to FIG. 3, a general overview of WSS devices will now be described. FIG. 3 illustrates schematically an exemplary WSS optical switching device 4 configured for switching input optical beams from three input optical fiber ports 5, 6 and 7 to an output optical fiber port 9. It will be appreciated that device 4 is reconfigurable such that input ports 5, 6 and 7 are able to be used as outputs and output port 9 used as an input. The optical beams are indicative of WDM optical signals, as mentioned above. On a broad functional level, device 4 performs a similar switching function to that described in U.S. Pat. No. 7,397,980 to Frisken, entitled "Dual-source optical wavelength processor" and assigned to Finisar Corporation, the contents of which are incorporated herein by way of cross-reference. The optical beams propagate from input ports 5, 6 and 7 in a forward direction and are reflected from an active switching element in the form of a liquid crystal on silicon (LCOS) device 11 in a return direction to output port 9. In other embodiments, other types of active switching elements are used in place of LCOS device 11, including arrays of individually controllable micro-electromechanical (MEMs) mirrors.

Device 4 includes a wavelength dispersive grism element 13 for spatially dispersing the individual wavelength channels from an input optical beam in the direction of a first axis (y-axis). It will be appreciated by persons skilled in the art that the dispersive element is not limited to a grism configuration, but may be any type of diffraction grating element. Grism element 13 operates in a manner described in U.S. Pat. No. 7,397,980. That is, to spatially separate the constituent wavelength channels contained within each optical beam in the y-axis according to wavelength. Grism 13 includes a diffraction grating portion which, in addition to the spatial diffraction function, also at least partially corrects beams for optical aberrations present in device 4.

A lens 15 is positioned adjacent to grism 13 such that the optical beams traverse the lens both prior to incidence onto grism 13 and after reflection from the grism. This double pass of lens 15 acts to collimate beams in the direction of a second axis (x-axis). Similarly, in propagating between input ports 5, 6 and 7 and LCOS device 11, the beams reflect twice off a cylindrical mirror 17. Mirror 17 has appropriate curvature such that each dispersed channel is focused onto the LCOS device in the y-axis.

The dispersed wavelength channels are incident onto LCOS device 11, which acts as a reflective spatial light modulator to actively independently steer each channel in the x-axis. At the device level, LCOS device 11 operates in a similar manner to that described in U.S. Pat. No. 7,092,599 to Frisken, entitled "Wavelength manipulation system and method" and assigned to Finisar Corporation, the contents of which are incorporated herein by way of cross-reference. As mentioned above, in other WSS designs, other types of switching element are used in place of LCOS device 11, such as micro electromechanical mirror (MEMs) arrays.

Description of Existing Grism Fabrication

Current techniques for fabricating high performance grisms include writing a diffraction grating onto a substantially planar glass wafer or slide, and subsequently bonding that wafer onto a prism with an epoxy, optical contact bonding or some other suitable bonding method.

The inventors of the subject invention have identified a number of problems associated with this two-step technique such as optical performance issues, as well as practical considerations with each step of the manufacturing process.

A major issue identified by the inventors with grisms made according to the two step process is that optical performance consistency is low. The source of the inconsistency has been attributed to mechanical and optical imperfections, such as foreign material or voids in the bond interface, delamination of the of the grating and prism, introduction of a depletion layer or layer with different refractive index or mechanical stress at the interface. These mechanical and optical imperfections have been attributed with introducing artifacts such as wave front distortion and ripple. This low performance consistency results is a reduction in the performance of the grism and ultimately the entire optical system.

Several practical complications have also been identified with the two step process. The first of these relates to the initial step of writing the grating onto the wafer. Practically, this step is performed using standard photolithography techniques commonly used in the semiconductor industry. These techniques require expensive semiconductor grade steppers, which require multiple exposures per wafer. The steppers also provide very low depth of focus which limits the grating writing to ultra-flat wafers or slides (typically <0.3 um) and have correspondingly low alignment tolerances with the photolithography mask to produce high resolution structures. Furthermore, this equipment is limited to operating on thin (typically 1 mm or less) slides only. This reliance on traditional photolithography techniques has been identified as a significant source of input costs when fabricating grisms due to the cost of the required equipment and the time required to achieve the necessary degree of alignment precision.

A second practical issue associated with the two step process is the alignment of the grating on the prism during the bonding step. This alignment step introduces additional potential for misalignments (in addition to the alignment of the mask during the first step) which have to be accounted for. This additional alignment requirement slows down the manufacturing process and requires additional equipment thereby further increasing the cost and complexity of grisms manufactured in this way.

In Situ Grism Fabrication

To overcome or ameliorate at least some of the issues identified with the prior art, the inventors have developed an in situ grism fabrication technique wherein the diffraction grating is formed directly onto a prism in situ rather than on a separate wafer element which is subsequently fixed to the prism. The basic in situ fabrication method 40 is outlined by the flow chart illustrated in FIG. 4 and the resulting structures are illustrated schematically in FIG. 5. An exemplary final grism fabricated from method 40 is illustrated schematically in FIG. 6.

Figure 4:
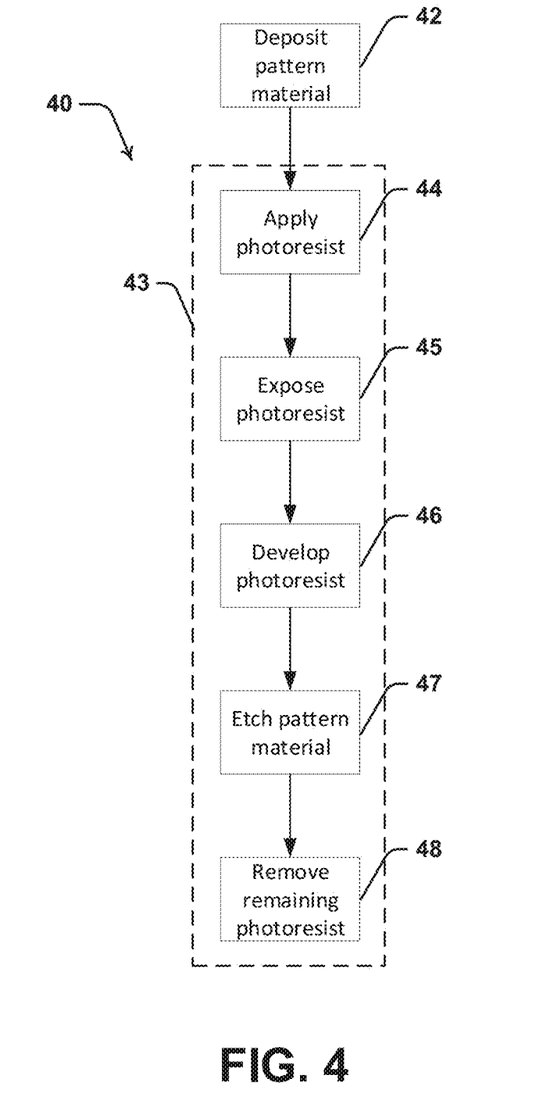
FIG. 4 is a process flow diagram illustrating the primary steps of a method of fabricating a grism having a diffractive surface that is formed in situ by a photolithographic technique.

Step 42 of fabrication method 40 involves depositing a layer of pattern material 52 directly onto surface 33 of prism 25 followed by a photolithography step 43. The deposition of the pattern material 52 onto the prism defines the diffractive surface 33 of the prism.

Deposition step 42 can be effected by any number of deposition techniques such as sputter coating, chemical vapour deposition, spin coating and thermal evaporation. It will be appreciated by those skilled in the art that the most appropriate technique for depositing the pattern material will be application specific and would not be limited to the examples provided above. Similarly, the most appropriate pattern material will be application specific but in general will be some high refractive index material such as silicon-nitride ($Si_3N_4$), $TiO_2$, $HfO_2$, amorphous silicon, high refractive index polymers such as spin-on-glass, photoresist, etc., $Ta_2O_5$ and metals.

The end result of photolithography step 43 is the production of a diffractive pattern in the pattern material to form a diffraction grating 1, which is formed in situ directly onto the prism. By "in situ", it is meant that steps 42 and 43 are performed directly onto a surface of prism 25, rather than fabricated on a separate substrate and subsequently brought into contact (e.g. bonded) with prism 25.

Photolithography step 43 includes a number of sub-steps which are described below.

The first sub-step 44 of the photolithography process 43 is to apply a layer of photoresist material 54 to the pattern material 52. The photoresist material 54 can be applied by any of the standard techniques such as spin coating, doctor blading, dip coating, spray coating, dry photoresist etc. The position of photoresist material 54 is illustrated in FIG. 5.

Figure 5:
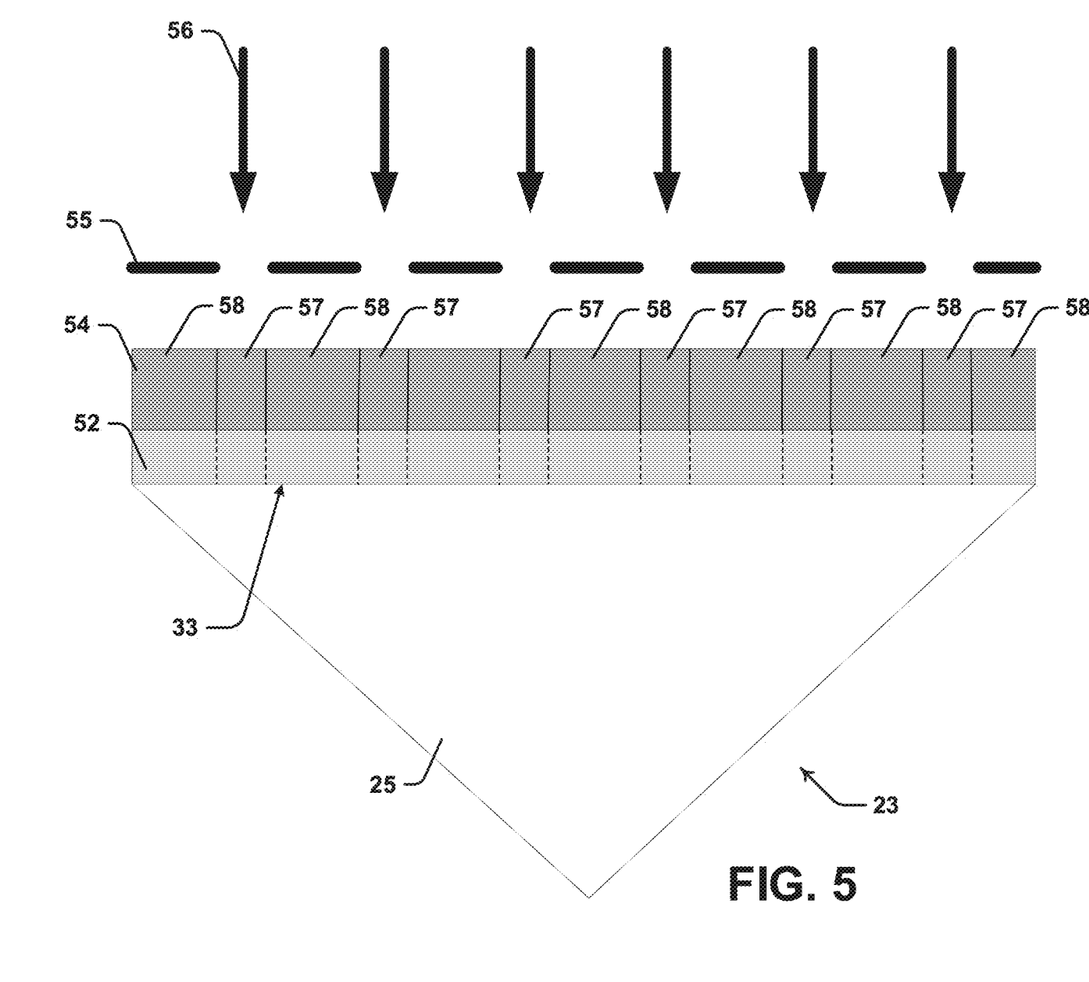
FIG. 5 is a schematic side view of a grism being fabricated according to the method of FIG. 4, the grism being illustrated during an exposure process.

The second sub-step 45 of the photolithography process 43 is to expose the photoresist material 54, as illustrated in FIG. 5. The prism 25, including the pattern material 52 and photoresist material 54, is then aligned to mask 55. The photoresist material 54 is then exposed to UV light 56 through mask 55 such that only selected to regions 57 are exposed to the UV light 56. The mask 55 controls which regions of the photoresist material 54 are exposed to the ultra-violet light 56.

The exposed regions 57 of photoresist are then removed through a chemical development step at sub-step 46, uncovering the underlying pattern material and producing a diffractive pattern in photoresist material 54. The unexposed regions 58 of photoresist remain in place. Although sub-step 45 has been described with reference to a positive photoresist, it will be appreciated that it can be equally achieved using a negative photoresist.

Etching sub-step 47 transfers the diffractive pattern in the photoresist material 54 to pattern material 52. The etching process involves removing uncovered pattern material while leaving the pattern material underlying the remaining photoresist 58 in place.

Figure 6:
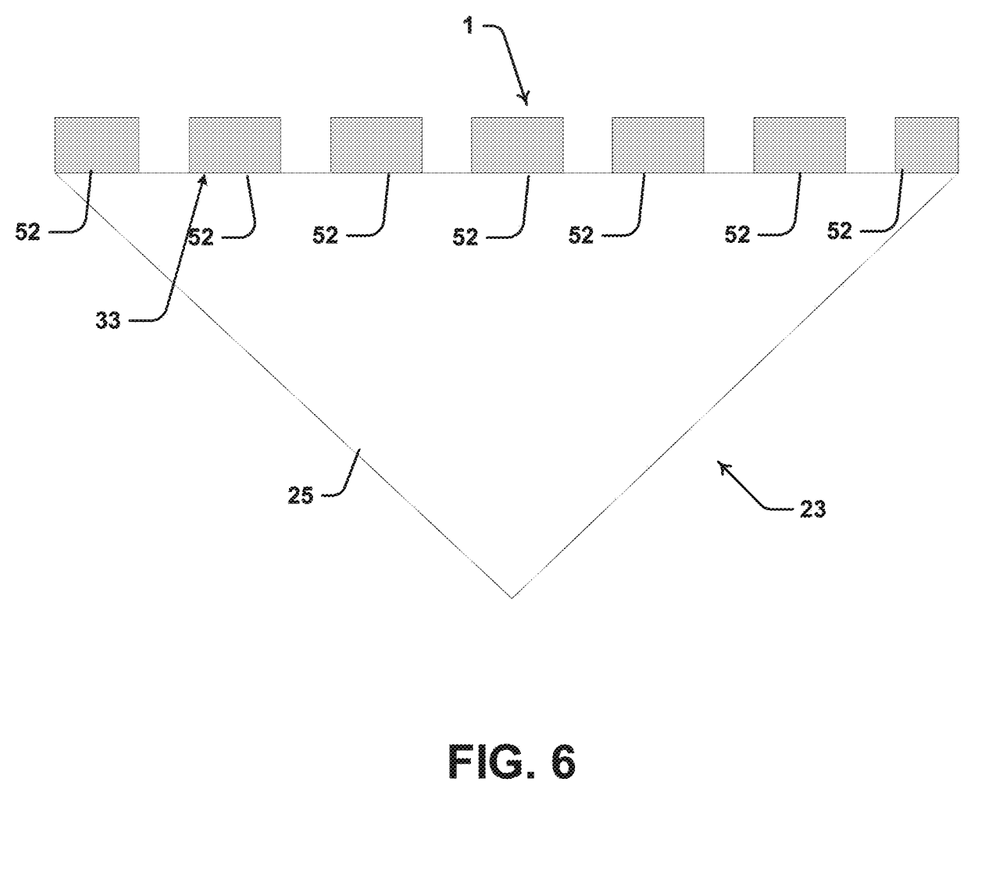
FIG. 6 is a schematic side view of a completed grism fabricated by the method of FIG. 4.

Washing sub-step 48 removes the remaining photoresist material 54, leaving the diffraction grating 1 on the prism 25 to define grism 23. An exemplary side view of the resulting grism 23 is shown in FIG. 6.

Figure 7:
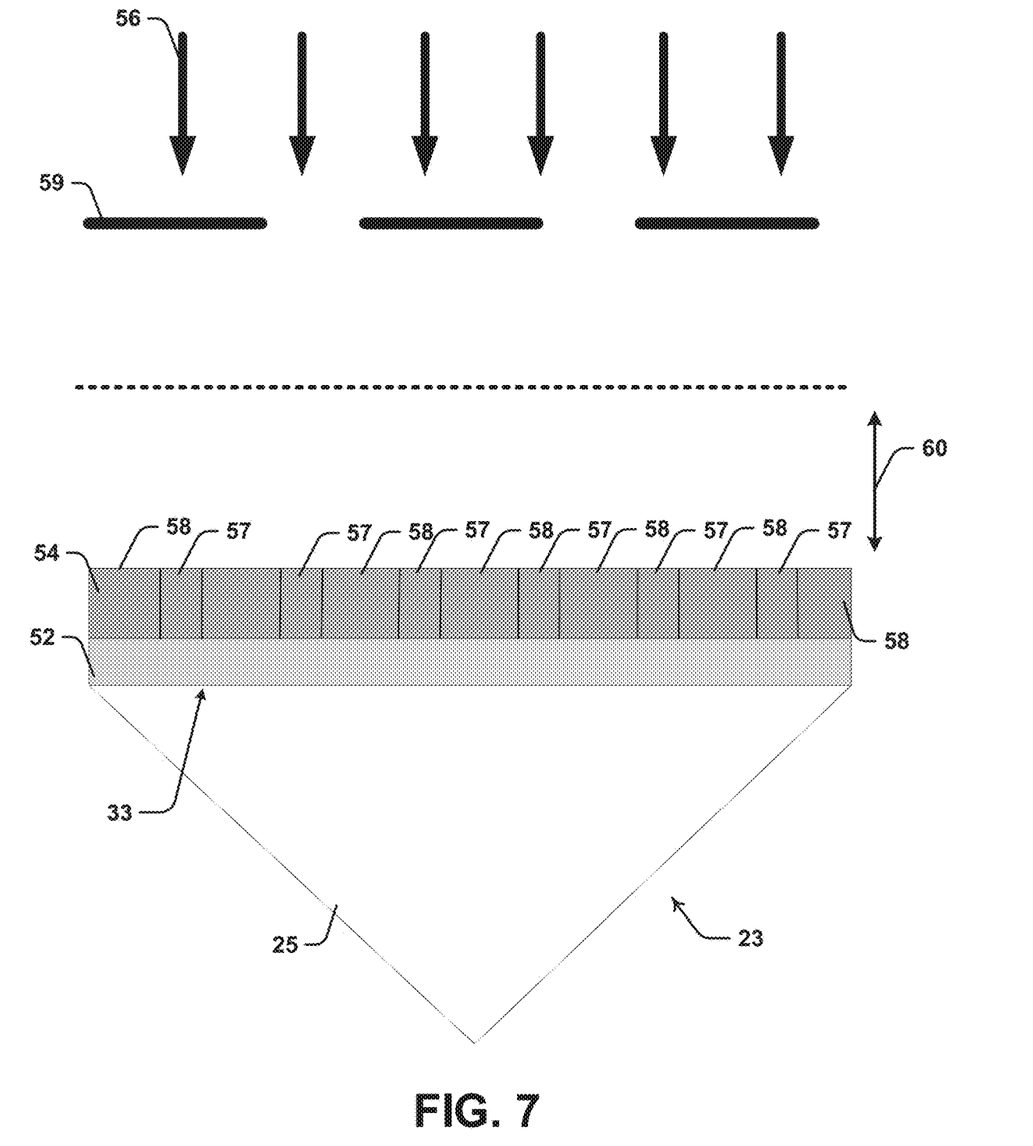
FIG. 7 is a schematic side view of a grism being fabricated according to the method of FIG. 4, the grism being illustrated during an alternative exposure process to that of FIG. 5.
Figure 8:
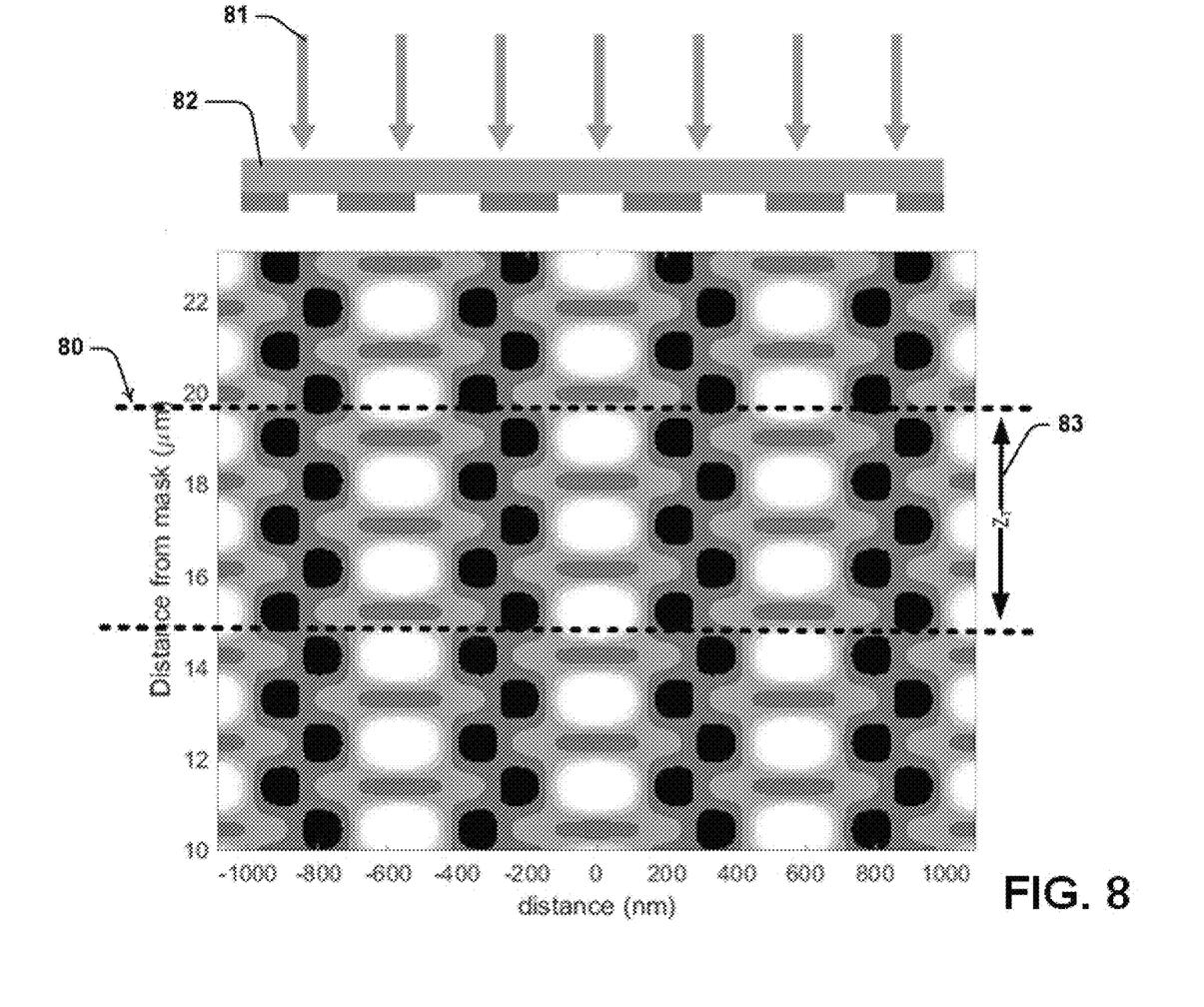
FIG. 8 is an illustration of an exemplary diffraction pattern produced by light passing through a mask structure.
Figure 9:
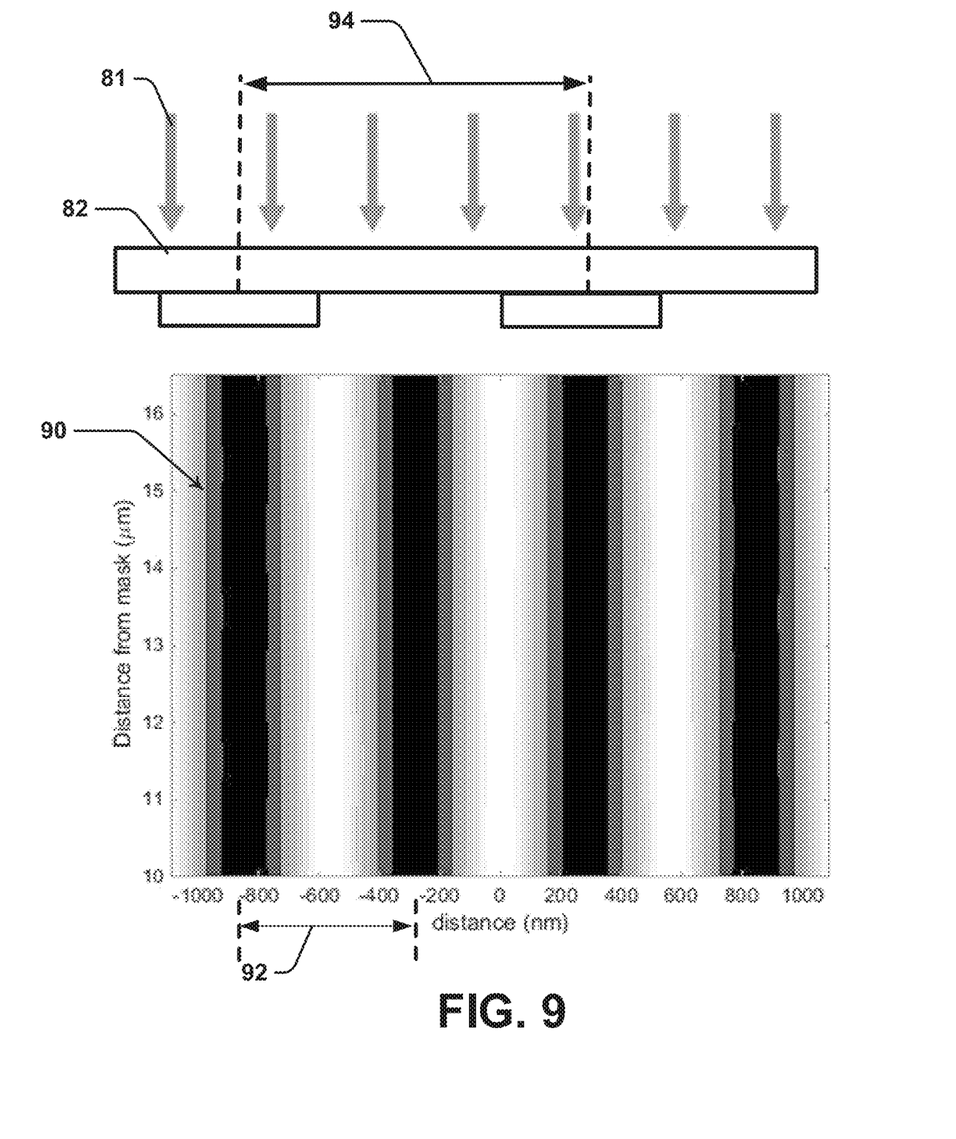
FIG. 9 is an illustration of an integrated diffraction pattern produced by light passing through a mask structure.

An alternative method for performing sub-step 45 of the photolithography process is illustrated schematically in FIG. 7 and explained with reference to FIGS. 8 and 9. Turning initially to FIG. 8, this method makes use of a diffraction pattern 80 created when UV light 81 passes through mask 82. The diffraction pattern 80 includes a repeating image of the mask 82 at regular distances away from mask 82. The regular distance at which the image repeats is given by the formula:

$$z_T = \frac{2p^2}{\lambda}$$

Where p is the period of mask 82 and $\lambda$ is the wavelength of UV light 81. Another property of diffraction pattern 80 is that if it is integrated along axis 83 over distance $z_T$, it produces irradiance field 90 shown in FIG. 9. Irradiance field 90 is related to the physical arrangement of the elements of mask 82 but has a period 92 equal to half the period 94 of mask 82. The inventors have identified that irradiance field 90 can be used for photolithography and would in practice have a very large depth of field. The large depth of field creates further relaxation on the alignment requirements thereby further reducing manufacturing times and costs. This alignment includes tilt alignment and surface flatness of surface 33. Furthermore, for a given grism design, a mask with larger spatial features can be used since the irradiance field will have half the period of the mask. Masks with larger spatial features are typically less costly to produce, thereby further reducing manufacturing costs for the grism. The requirements of the UV light source can similarly be relaxed allowing longer wavelengths to be used. For example, many prior art systems make use of deep UV light with a wavelength of 193 nm whereas this method allows for the use of a wavelength of 365 nm for a comparable grism. In all, the second method may be able to reduce grism manufacturing costs by around 85%.

Practically, irradiance field 90 can be used in photolithography by moving the irradiance target, the photoresist, through diffraction pattern 80 of FIG. 8, along axis 83 for a distance equal to $z_T$. This motion is represented by the arrow 60 shown in FIG. 7 where the diffraction pattern is created by passing light 56 through mask 59. This motion may be effected in a substantially continuous or stepwise manner by any standard actuator. This motion selectively exposes certain sections of the photoresist to the UV light to define an exposure pattern, resembling the mask but with half the spatial period. Mask 59 has twice the spatial period of mask 55 and results in the same grism 23 shown in FIG. 6. The remaining sub-steps 46 to 48 are performed as described above to produce grism 23.

This method, as previously mentioned, greatly relaxes alignment requirements increasing throughput of the manufacturing process and reducing the cost of the equipment required.

A further advantage is that exposure sub-step 45 permits multiple gratings to be exposed simultaneously. This is can be achieved by utilising a mask which is multiple times larger than diffraction surface 33, thereby allowing multiple prisms to be aligned to a single mask and simultaneously exposed. It will be appreciated that this can greatly increase the productivity of the fabrication process 40.

In addition to being applicable to the direct writing of gratings onto prisms having non-parallel surfaces, the invention is also applicable to writing gratings onto optical elements having thicknesses greater than a typical wafer (less than about 1 mm). In particular, the above described process is applicable for directly writing a diffraction grating onto a surface of a prism structure having a thickness of greater than 5 mm. That is, the input surface and the diffractive surface are separated by a distance of greater than 5 mm.

CONCLUSIONS

The single process technique of the present invention negates the costly and time consuming process of patterning optical components. It also eliminates bonding of optical components—optical component bonding requires additional equipment and reduces inconsistencies introduced by multi-stage processes.

The present invention enables manufacture of grism assemblies with higher performance and higher consistency, while reducing the cost by up to over 85%.

The equipment associated with the method of the present invention is about 20 times cheaper than current grism fabrication methods, and able to expose multiple components simultaneously with a single mask. This method uses a larger wavelength light source (i-line @ 365 nm) compared to DUV@193 nm, which in turn allows for cheaper masks. The equipment is also not confined to exposing wafers, and can pattern prisms/odd shaped glass.

INTERPRETATION

It will be understood by one skilled in the art that the frequency and wavelength of a laser beam are connected by the equation:

Speed of light=wavelength*frequency.

As a consequence, when reference is made to frequency shifting, frequency converting, frequency broadening, different frequencies and similar terms, these are interchangeable with the corresponding terms wavelength shifting, wavelength converting, wavelength broadening, different wavelengths and the like.

Throughout this specification, use of the term "element" is intended to mean either a single unitary component or a collection of components that combine to perform a specific function or purpose.

Throughout the specification, the terms "manufacture" and "fabricate", including their derivatives, should be interpreted as being synonyms.

Throughout the specification, the terms "optical" in the sense of "optical signal" and the like should be interpreted to include parts of the electromagnetic spectrum within and beyond the visible range, including but not limited to the infrared and ultraviolet ranges.

Unless specifically stated otherwise, as apparent from the following discussions, it is appreciated that throughout the specification discussions utilizing terms such as "processing," "computing," "calculating," "determining", analyzing" or the like, refer to the action and/or processes of a computer or computing system, or similar electronic computing device, that manipulate and/or transform data represented as physical, such as electronic, quantities into other data similarly represented as physical quantities.

In a similar manner, the term "controller" or "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

Reference throughout this specification to "one embodiment", "some embodiments" or "an embodiment" means that a particular feature, structure or characteristic described in connection with the embodiment is included in at least one embodiment of the present disclosure. Thus, appearances of the phrases "in one embodiment", "in some embodiments" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

It should be appreciated that in the above description of exemplary embodiments of the disclosure, various features of the disclosure are sometimes grouped to together in a single embodiment, Fig., or description thereof for the purpose of streamlining the disclosure and aiding in the understanding of one or more of the various inventive aspects. This method of disclosure, however, is not to be interpreted as reflecting an intention that the claims require more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those skilled in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

Similarly, it is to be noticed that the term coupled, when used in the claims, should not be interpreted as being limited to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical, electrical or optical contact, or that two or more elements are not in direct contact with each other but yet still co-operate or interact with each other.

Thus, while there has been described what are believed to be the preferred embodiments of the disclosure, those skilled in the art will recognize that other and further modifications may be made thereto without departing from the spirit of the disclosure, and it is intended to claim all such changes and modifications as fall within the scope of the disclosure. For example, any formulas given above are merely representative of procedures that may be used. Functionality may be added or deleted from the block diagrams and operations may be interchanged among functional blocks. Steps may be added or deleted to methods described within the scope of the present disclosure.

We claim:

1. A method of fabricating a diffractive optical element, the method including the steps:
depositing a pattern material layer of pattern material directly onto a first surface of a non-cuboid prism, wherein the first surface is non parallel to either or both of an input surface configured to receive an input optical signal and an output surface configured to output a dispersed signal from the diffractive optical element;
applying a photoresist layer to the pattern material layer;
creating a diffractive pattern in the photoresist layer by illuminating the photoresist layer through a photo mask while moving the photoresist layer substantially perpendicular relative to the photo mask; and
transferring the diffractive pattern in the photoresist layer to the pattern material layer to define a diffractive surface on the first surface.

2. The method of fabricating the diffractive optical element according to claim 1 wherein:
the diffractive surface and the output surface are non-parallel;
the input surface and the diffractive surface are non-parallel;
the input surface is the output surface;
the input surface is the diffractive surface; or
the input surface and the diffractive surface are separated by a distance of greater than 5 mm.

3. The method of fabricating the diffractive optical element according to claim 1 wherein the diffractive optical element is a triangular prism, a trapezoid, or a non-wafer structure.

4. The method of fabricating the diffractive optical element according to claim 1 wherein creating the diffractive pattern in the photoresist layer comprises using a light source.

5. The method of fabricating the diffractive optical element according to claim 1 wherein the pattern material is selected from one or more of Si3N4, TiO2, HfO2, amorphous silicon, high refractive index polymer, spin-on-glass, photoresist, reflective metal, chromium, gold, silver, aluminum, nickel, and Ta2O5.

6. The method of fabricating the diffractive optical element according to claim 1 wherein the photoresist layer includes an anti-reflective coating and primer.

7. The method of fabricating the diffractive optical element according to claim 1 wherein the movement is substantially continuous or stepwise.

8. The method of fabricating the diffractive optical element according to claim 1 wherein the photoresist layer is moved a distance of $$z_T = \frac{2p^2}{\lambda}$$

where p is a spatial period of the photo mask and $\lambda$ is a wavelength of the illumination.

9. The method of fabricating the diffractive optical element according to claim 7 wherein the photoresist layer is moved a distance of $$z_T = \frac{2p^2}{\lambda}$$

where p is a spatial period of the photo mask and $\lambda$ is a wavelength of the illumination.

10. The method of fabricating the diffractive optical element according to claim 1 wherein the diffractive optical element is configured to operate in a wavelength selective switch; and/or wherein the input optical signal includes a plurality of optical wavelength channels.

11. The method of fabricating the diffractive optical element according to claim 1 wherein the diffractive optical element includes a lens.

12. A method of fabricating a diffractive optical element, the method including the steps:
depositing a photoresist layer directly onto a first surface of a non-cuboid prism, wherein the first surface is non parallel to either or both of an input surface configured to receive an input optical signal and an output surface configured to output a dispersed signal from the diffractive optical element; and
creating a diffractive pattern in the photoresist layer to define a diffraction surface on the first surface by illuminating the photoresist layer through a photo mask while moving the photoresist layer substantially perpendicular relative to the photo mask.

13. The method of fabricating the diffractive optical element according to claim 12 wherein creating the diffractive pattern in the photoresist layer comprises using a light source.

14. The method of fabricating the diffractive optical element according to claim 12 wherein:
the diffractive surface and the output surface are non-parallel;
the input surface and the diffractive surface are non-parallel;
the input surface is the output surface;
the input surface is the diffractive surface;
the input surface and the diffractive surface are separated by a distance of greater than 5 mm; or
the diffractive optical element is configured to operate in a wavelength selective switch.

15. The method of fabricating the diffractive optical element according to claim 12 wherein the diffractive optical element includes a lens.

16. The method of fabricating the diffractive optical element according to claim 12 wherein the pattern material is selected from one or more of Si3N4, TiO2, HfO2, amorphous silicon, high refractive index polymer, spin-on-glass, photoresist, reflective metal, chromium, gold, silver, aluminum, nickel, and Ta2O5.

17. The method of fabricating the diffractive optical element according to claim 12 wherein the photoresist layer includes an anti-reflective coating and primer.

18. The method of fabricating the diffractive optical element according to claim 12 wherein the movement is substantially continuous or stepwise.

19. The method of fabricating the diffractive optical element according to claim 12 wherein the photoresist layer is moved a distance of $$z_T = \frac{2p^2}{\lambda}$$

where p is a spatial period of the photo mask and $\lambda$ is a wavelength of the illumination.

20. The method of fabricating the diffractive optical element according to claim 12 wherein creating the diffractive pattern by illuminating the photoresist layer through the photo mask while moving the photoresist layer substantially perpendicular relative to the photo mask comprises producing an irradiance field having a first spatial period that is half of a second spatial period of the photo mask.

21. The method of fabricating the diffractive optical element according to claim 12 wherein creating the diffractive pattern by illuminating the photoresist layer through the photo mask while moving the photoresist layer substantially perpendicular relative to the mask comprises one or more of:
 relaxing tilt alignment between the photo mask and the first surface of the non-cuboid prism;
 relaxing flatness of the first surface of the non-cuboid prism; and
 relaxing ultraviolet light for the illumination to a longer wavelength.

22. The method of fabricating the diffractive optical element according to claim 12 comprising using the photo mask that is multiple times larger than the first surface of the non-cuboid prism; aligning multiple ones of the non-cuboid prism to the same photo mask; and simultaneously exposing the multiple non-cuboid prisms with the illumination.

23. The method of fabricating the diffractive optical element according to claim 1 wherein creating the diffractive pattern by illuminating the photoresist layer through the photo mask while moving the photoresist layer substantially perpendicular relative to the photo mask comprises producing an irradiance field having a first spatial period that is half of a second spatial period of the photo mask.

24. The method of fabricating the diffractive optical element according to claim 1 wherein creating the diffractive pattern by illuminating the photoresist layer through the photo mask while moving the photoresist layer substantially perpendicular relative to the photo mask comprises one or more of:
 relaxing tilt alignment between the photo mask and the first surface of the non-cuboid prism;
 relaxing flatness of the first surface of the non-cuboid prism; and
 relaxing ultraviolet light for the illumination to a longer wavelength.

25. The method of fabricating the diffractive optical element according to claim 1 comprising using the photo mask that is multiple times larger than the first surface of the non-cuboid prism; aligning multiple ones of the non-cuboid prism to the same photo mask; and simultaneously exposing the multiple non-cuboid prisms with the illumination.

\* \* \* \* \*